United States Patent [19]

Sachs

[11] Patent Number: 4,878,106
[45] Date of Patent: Oct. 31, 1989

[54] SEMICONDUCTOR CIRCUIT PACKAGES FOR USE IN HIGH POWER APPLICATIONS AND METHOD OF MAKING THE SAME

[75] Inventor: Klaus Sachs, Osterode/Harz, Fed. Rep. of Germany

[73] Assignee: Anton Piller GmbH & Co. KG, Osterode/Harz, Fed. Rep. of Germany

[21] Appl. No.: 191,841

[22] Filed: May 6, 1988

Related U.S. Application Data

[63] Continuation of Ser. No. 936,797, Dec. 2, 1986, abandoned.

[51] Int. Cl.$^4$ .................. H01L 23/30; H01L 23/18; H01L 23/34
[52] U.S. Cl. .................................. 357/72; 357/75; 357/74
[58] Field of Search .................. 357/72, 74, 75, 80, 357/81; 174/52.4

[56] References Cited

U.S. PATENT DOCUMENTS

| | | | |
|---|---|---|---|
| 3,839,660 | 10/1974 | Stryker | 357/67 |
| 4,480,262 | 10/1984 | Butt | 357/81 |
| 4,604,642 | 8/1986 | Sakurai | 357/72 |

FOREIGN PATENT DOCUMENTS

| | | | |
|---|---|---|---|
| 24955 | 3/1981 | Japan | 357/75 |
| 147172 | 5/1982 | Japan | 357/75 |
| 130553 | 8/1983 | Japan | 357/75 |
| 225553 | 12/1984 | Japan | 357/74 |
| 1139345 | 1/1969 | United Kingdom | 357/75 |

*Primary Examiner*—Rolf Hille
*Assistant Examiner*—S. V. Clark
*Attorney, Agent, or Firm*—Gottlieb, Rackman & Reisman

[57] ABSTRACT

A transfer molded semiconductor circuit package with two spaced, parallel, exteriorly accessible substrate plates located symmetrically to a medial plane of the package and encapsulated, to levels flush with their remote faces, in a body of low stress semiconductor grade molding compound. The package has precisely parallel outer faces constituted at least in part by the remote faces of the substrate plates and enabling full-surface engagement of the substrate plates with respective heat sinks. A method of making the package is also disclosed. The symmetry of the arrangement of the substrate plates inhibits any bending thereof during the molding of the package such as would occur in a single substrate plate due to differences between the thermal expansion coefficients of the molding compound and the substrate plates.

11 Claims, 4 Drawing Sheets

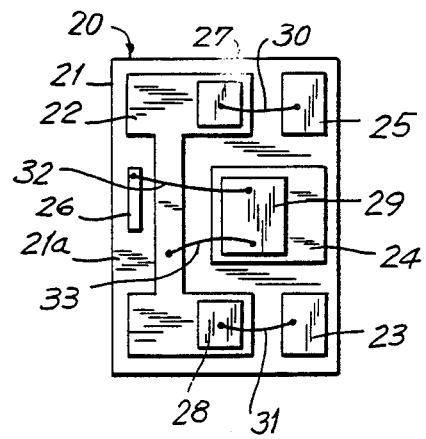
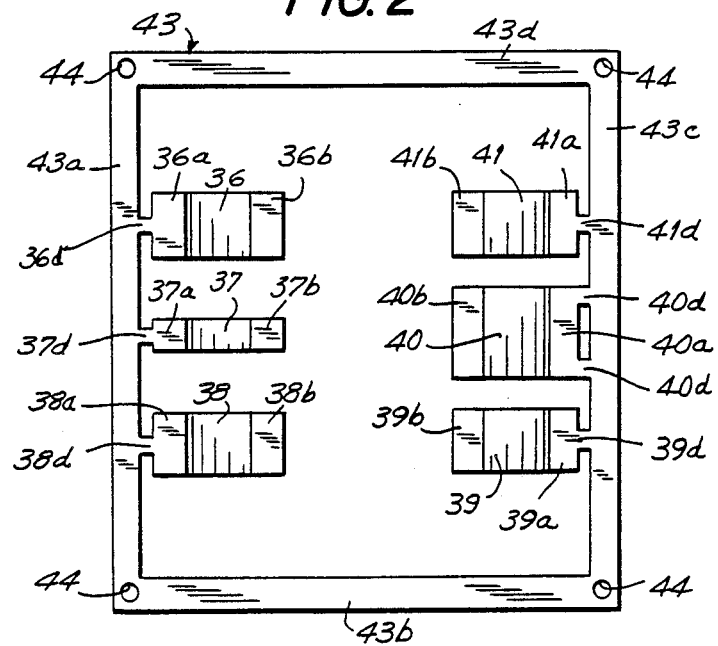

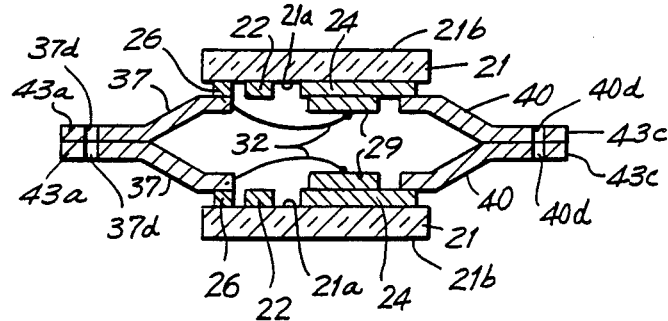
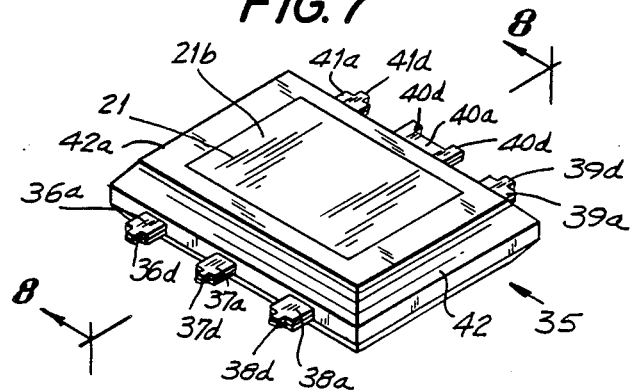
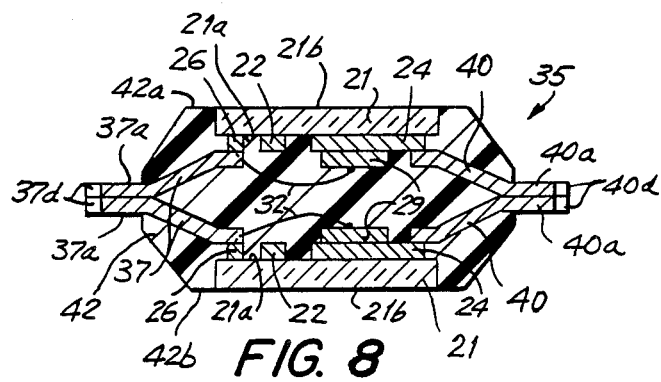

SEMICONDUCTOR CIRCUIT PACKAGES FOR USE IN HIGH POWER APPLICATIONS AND METHOD OF MAKING THE SAME

This application is a continuation of now abandoned application, Ser. No. 06/936,797, filed on Dec. 2, 1986.

This invention relates to semiconductor circuit packages, and in particular to packages of semiconductor circuit modules for use in high power applications. Merely by way of example, the packages according to the present invention are particularly suited for use as high power hybrid modules adapted to be used in such devices as high speed switching arrangements, static inverters, automotive drives, automobile electronics, and the like.

Semiconductor circuit modules including, in each case, a substrate plate carrying on one of the flat faces thereof a plurality of planar conductor layers and appropriate semiconductor circuit means such as one or more transistors, thyristors, diodes, integrated circuits, and the like, are well known. It is frequently attempted, for the purpose of protecting the semiconductor circuit means and their connections, to encapsulate the substrate plates and their circuit components in a suitable potting compound, e.g., a liquid thermosetting material such as epoxy. Because of the nature of the potting material and the difficulties inherent in storing and activating the same, however, the manufacture of semiconductor circuit packages using such materials is relatively uneconomical.

It has further been proposed to encapsulate each such circuit module in a body of thermosetting molding compound by means of a transfer molding process. However, this type of process for forming a package has only been deemed suitable for power application components when these are of relatively small size, on the order of 0.5 inch by 0.5 inch, intended for single side cooling. The transfer molding approach has also been proposed for use in connection with larger units but only in low power applications, such as microprocessors, memories, gate arrays, and the like, which require no cooling by means of heat sinks.

When attempts have been made, however, to produce large high power hybrids, the aforesaid packaging processes have run into difficulties. On the one hand, hybrids protected with potting compounds such as liquid thermosetting resins have been not only expensive to make but have been characterized by electrical properties not suited for high power applications. On the other hand, the use of transfer molding for forming single-module packages of relatively large size, on the order of 4 inches by 4 inches, has run into problems because of the differences between the thermal expansion coefficients of the molding compounds used and the materials of which the module substrate plates are made. For example, the thermal expansion coefficient of the molding compound ordinarily is at least three to four times as large as the thermal expansion coefficient of the usual substrate plate materials such as $Al_2O_3$ and AlN. The result is that during the molding operation the substrate plates become bent out of their desired perfectly flat shape, which reduces the degree of surface contact that can be achieved between the outer surface of such a substrate plate and the heat sink, that is to say, the contact between the substrate plate and the heat sink will be reduced to a line contact or possibly even a point contact rather than a surface contact. On the other hand, where the heat sink is soldered or otherwise affixed to the substrate plate, the bending of the latter will result in a stressing of the solder joint and may lead to a separation of the heat sink from the substrate plate. In any such case, therefore, the heat transfer will be correspondingly reduced, which may lead to an overheating of the semiconductor circuit module.

It is the principal object of the present invention, therefore, to provide transfer molded semiconductor circuit packages which are suited for use in high power applications, are characterized by flat outer surfaces each constituted at least in part by the outer surface of a respective substrate plate of a semiconductor circuit module or the outer surface of a thermally highly conductive layer affixed to the outer surface of the substrate plate, and are free of the drawbacks and disadvantages of known semiconductor circuit packages.

It is a further object of the present invention to provide a novel and improved process of making such semiconductor circuit packages, in which process any thermally induced bending of the substrate plates during the encapsulation thereof by the molding compound is effectively inhibited.

Generally speaking, the objectives of the present invention are achieved by a semiconductor circuit package which includes first and second spaced parallel substrate plates each having a first flat face, a second flat face parallel to the first flat face, and an outwardly directed peripheral edge face, the two substrate plates being arranged in spaced, substantially parallel relation to each other with the first flat faces thereof directed away from each other and with the second flat faces thereof directed away from each other. At least one of the substrate plates on the first flat face thereof has affixed thereto a respective plurality of discrete Planar conductor layers, and at least one of the substrate plates at the first flat face thereof carries semiconductor circuit means electrically connected to one or more of the planar conductor layers The package further includes leads extending laterally of the substrate plates, each lead having an outward end region adapted to be electrically connected to exterior circuit components and an inward end region affixed to a respective one of the planar conductor layers, and a transfer molded body of thermosetting semiconductor grade molding compound filling the space between the substrate plates and encapsulating the first flat faces of the substrate plates, the conductor layers, the semicondutor circuit means and the inward end regions of the leads. The second flat faces of the first and second substrate plates are free of molding compound. The package by virtue of its construction is resistant to thermally induced bending of the two substrate plates during and at all time subsequent to the molding of the body of molding compound, as result of which the second flat face of each substrate plate remains substantially flat and substantially parallel to the second flat face of the other substrate, plate and the package is adapted for full-surface contact of each substrate plate at the second flat face thereof with a respective heat sink.

In a particular embodiment of the present invention, each of the substrate plates has affixed to its first flat face a respective plurality of the discrete planar conductor layers, each. The substrate plates at its first flat face carries respective semiconductor circuit means electrically connected to one or more of the associated planar conductor layers, and the leads are in the form of first and second sets of stiff leads extending out of the package laterally of the substrate plates, each lead having its outward end region disposed in a plane intermediate the planes of the substrate plates and having its inward end region offset from the plane of its outward end region, with the outward end regions of each set of leads lying against those of the other set. Preferably also, the molded body of molding compound encapsulates the peripheral edge faces of the two substrate plates as well and has opposite parallel planar surfaces each of which is flush with the exposed second flat face of a respective one of the substrate plates. and in the preferred embodiment of the invention are constituted to a major degree by the exposed second.

In accordance with a refinement of the present invention, the two substrate plates incorporated in the package have affixed to their second flat faces respective layers of thermally highly conductive material by which to enhance the heat distribution over the outer surfaces of the circuit modules and the dissipation of heat from the package, with the transfer molded body of the package preferably also encapsulating the peripheral edge faces of the two layers of thermally highly conductive material and having its opposite parallel planar surfaces disposed flush with the exposed surfaces of the layers of thermally highly conductive material.

Insofar as the method of making such packages is concerned, the objectives of the present invention are achieved by providing first and second stiff, planar, closed frames of electrical conductor material, the inner dimensions of each frame being sufficient to enable that frame to gird a respective one of the two substrate plates, and each frame including a plurality of stiff leads located inwardly of that frame, with each lead having an outward end region severably affixed to and disposed substantially in the plane of its respective frame and an inward end region offset from the plane of its respective frame. With each such frame in girding relation to its respective substrate plate, the inner end regions of the leads are affixed to respective ones of the planar conductor layers on the first flat faces of the two substrate plates so as to dispose each of the latter in a plane spaced from and parallel to the plane of its respective frame. The frames are then sandwiched with each other so that the surface of each frame which is directed away from its associated substrate plate is in flush contact with the corresponding surface of the other frame and so that the respective first flat faces of the substrate plates are disposed in confronting relation to each other, the substrate plates as a consequence being symmetrically disposed in spaced parallel planes at opposite sides of the sandwiched frames by virtue of the degrees of offset of the inward end regions of the leads from the planes of the first and second frames. A quantity of thermosetting semiconductor molding compound is then transfer molded into the assembly of the frames and the substrate plates in a suitable mold in which the substrate plates are held in position by the frames through the intermediary of the lead elements thereof, so as to form a body of molding compound filling the space between the two substrate plates and encapsulating the confronting first flat faces of the substrate plates, the planar conductor layers, the semiconductor circuit means and the inward end regions of the leads and in the preferred embodiment of the present invention also the outer peripheries of the substrate plates while leaving the frames, the outward end regions of the leads and the second flat faces of the substrate plates free of molding compound. Upon completion of the molding operation and removal of the package from the mold, the sandwiched frames are severed form the outward end regions of the leads, leaving the latter accessible and adapted for connection to exterior circuit components.

In the variant of the process according to the present invention where +.he second flat faces of the substrate plates are covered at least partially by layers of thermally highly conductive material, the transfer molding operation is performed so as to leave free of molding compound the exposed faces of those thermally highly conductive layers rather than the second faces of the substrate plates.

By virtue of the symmetrical arrangement of the substrate plates in the process of the present invention therefore, any bending of the substrates plates both during and subsequent to the molding operation, such as would occur in the case of a single-module package due to the differences between the thermal expansion coefficients of the molding compound and the substrate plates, is effectively inhibited, thereby ensuring that the finished package will have precisely flat and parallel opposite surfaces for flush full-surface contact with respective heat sinks.

The semiconductor circuit packages according to the present invention and the method of making the same afford a number of valuable advantages. The molding compounds which are capable of being processed in a transfer molding operation such as that used in the method of the present invention have outstanding electrical characteristics which ensure continued proper operation of the circuitry encapsulated therein. Moreover, the packages according to the present invention are relatively inexpensive to make, and the process lends itself readily to automated production techniques. The packages themselves further make it possible to use smaller heat sinks than are conventionally used, because the double side cooling characterizing the packages of the present invention enables a better distribution of heat in and a faster dissipation of heat from the packages. Also, the packages permit a higher power output per volume unit than can be achieved with other packages of this type. Also, since the circuit elements of such a package are in close proximity to one other, it becomes possible to achieve low impedance between those circuit elements, if that is required in any given application.

The foregoing and other objects, characteristics and advantages of the present invention will be more clearly understood from the following detailed description thereof when read in conjunction with the accompanying drawings, in which;

FIG. 1 is a diagrammatic illustration, in plan, of a semiconductor circuit module to be incorporated in a semiconductor circuit package according to the present invention;

FIG. 2 is a plan view of a circumferentially closed lead frame adapted to be used in the manufacture of the semiconductor circuit packages according to the present invention;

Figure 3:
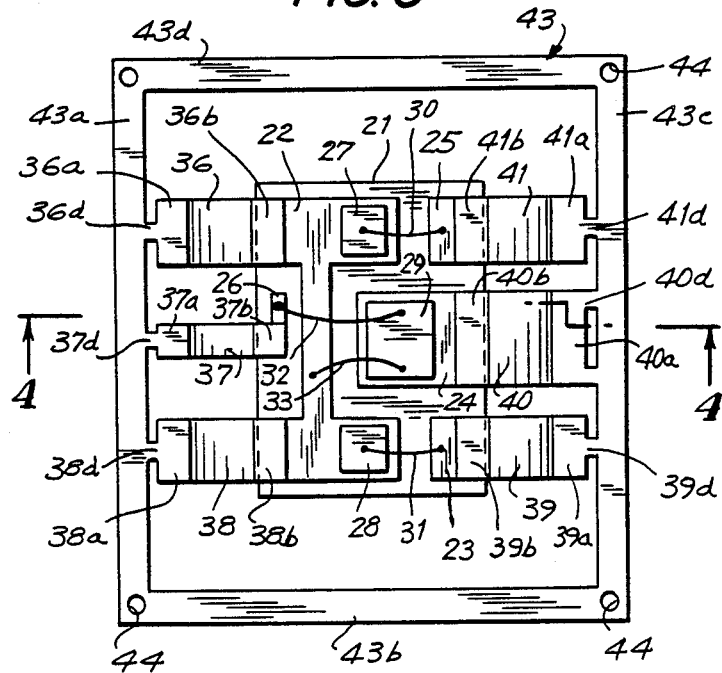
FIG. 3 is a plan view of the lead frame of FIG. 2 combined with the semiconductor circuit module of FIG. 1 preparatory to the making of a package according to the present invention.
Figure 4:
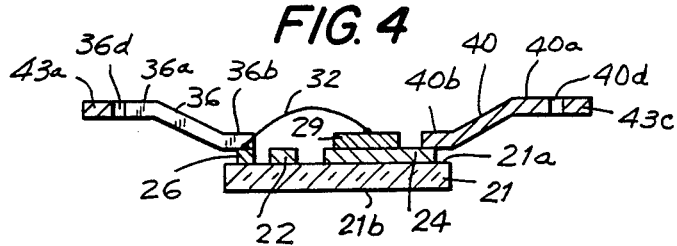
Figure 5:
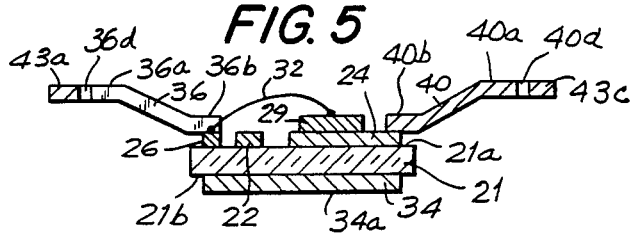
Figure 9:
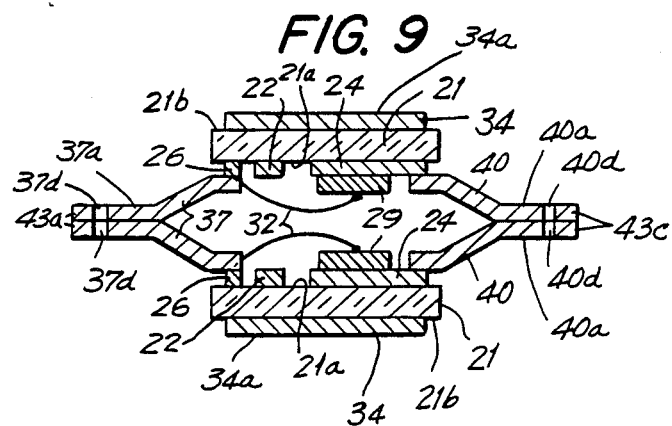
Figure 10:
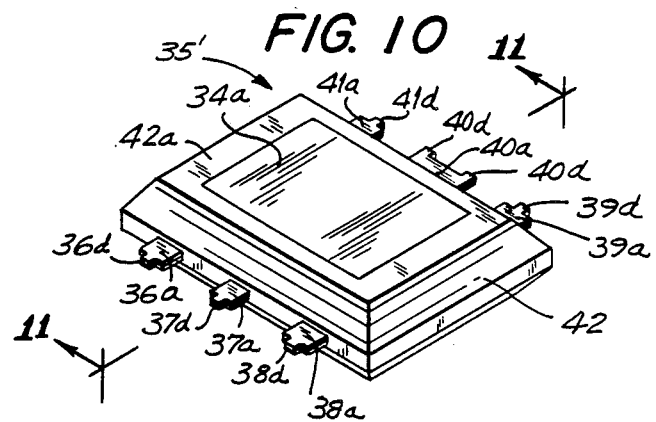
Figure 11:
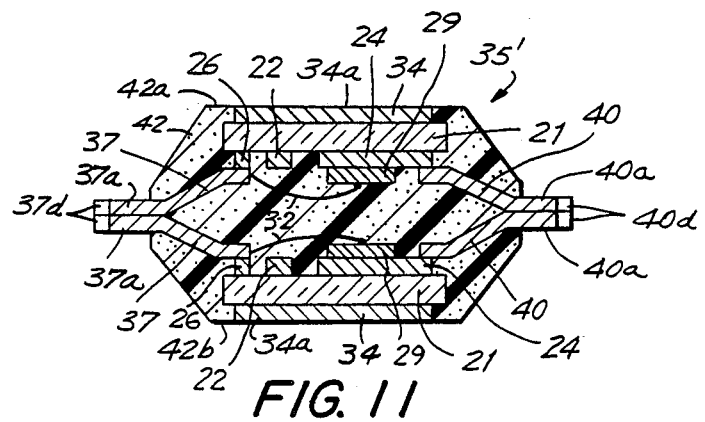

FIG. 4 is a sectional view taken along the line 4—4 in FIG. 3 and shows the frame affixed to a circuit module the substrate plate of which does not have a layer of thermally highly conductive material affixed to its face directed away from the frame; FIG. 5 is a sectional view similar to FIG. 4 but shows the substrate plate of the semiconductor circuit module as having a layer of thermally highly conductive material affixed to the face thereof directed away from the frame; FIG. 6 is a vertical section through an assembly of two lead frame and circuit module combinations of the type shown in FIG. 4; FIG. 7 is a perspective illustration of a finished semiconductor circuit module package according to the present invention formed from the lead frame and circuit module assembly shown in FIG. 6; FIG. 8 is a sectional view taken along the line 8—8 FIG. 7;

FIG. 9 is a vertical section through an assembly of two lead frame and circuit module combinations of the type shown in FIG. 5;

FIG. 10 is a perspective illustration of a finished semiconductor circuit package made from the assembly shown in FIG. 9; and FIG. 11 is a sectional view taken along the line 11—11 in FIG. 10.

Referring now to the drawings in greater detail, FIG. 1 shows diagrammatically a semiconductor circuit module 20 which is to be incorporated in a semiconductor circuit package according to the present invention. The module 20 includes a substrate plate 21 of conventional electrically nonconductive material such as alumina ($Al_2O_3$) or aluminum nitride (AlN). The substrate plate 21, which is shown as being rectangular in outline but may have any desired configuration, has first and second opposite flat faces 21a and 21b (see FIGS. 4 and 5) on the former of which are affixed, in any conventional manner as is well known to those skilled in the art, a plurality of discrete planar conductor layers 22, 23, 24, 25 and 26, preferably of copper. Generally, the substrate plates, which may also be made of other appropriate materials than those mentioned above, will each be about 0.6 mm to about 1 mm thick, while the planar conductor layers will each be about 0.1 mm to about 0.3 mm thick, all as is well known in the art. The number, distribution and configurations of the conductor layers 22-26 may, of course, vary from those shown in FIG. 1, as dictated by the intended end use requirements of the module 20.

Suitably affixed to some of the planar conductor layers are respective semiconductor circuit means 27, 28 and 29, such as transistors, diodes, thyristors, SCR's, MOS devices, integrated circuits of various types, etc. (hereinafter occasionally referred to as silicon chips), various arrangements of which including, in some cases, as few as one such circuit means and in others, e.g. large power hybrids, many more, are well known to those skilled in the art and need not be described in detail herein. In the illustrated power module arrangement, each of the chips 27, 28 and 29 has one terminal electrically connected to its underlying planar conductor layer and one or more additional terminals electrically connected by bond wires 30, 31, 32 and 33 to one or more others of the various planar conductor layers.

The second flat face 21b of the substrate plate 21 may be either bare, as shown in FIG. 4, or may have a layer 34 of thermally highly conductive material, such as copper, affixed thereto and preferably covering a major portion of the face 21b, as shown in FIG. 5. Thus, in the case of the module shown in FIG. 4, the face of the substrate plate which is opposite the face thereof that carries the conductor layers and the semiconductor circuit means is intended for direct engagement with a heat sink, while in the case of the module shown in FIG. 5, it is the exposed face 34a of the layer 34 which is intended for direct engagement with a heat sink, to enable heat generated during the operation of the power circuitry to be dissipated from the module.

As previously stated, in order to protect the power module components it is generally desirable and customary to encapsulate the module in a suitable thermosetting insulating material so as to form a package including the module and the surrounding body of material. It has been found, however, that encapsulating a power hybrid in a liquid thermoset potting compound, such as a liquid room temperature curing epoxy, is not satisfactory for high power applications, because such compounds, besides being difficult to store and handle and thereby increasing the cost of producing the packages, do not possess sufficiently good electrical and thermal properties.

On the other hand, encapsulating a single power hybrid in a semiconductor grade thermosetting molding compound by transfer molding is also not fully satisfactory, because the thermal expansion coefficient of such a compound (say, $18 \times 10^{-6}$ or more) is usually at least three or four times higher than the thermal expansion coefficient of the substrate plate of the module. As a result, at the normal molding temperature of, say, 170°-180° C., the substrate plate, especially if relatively large (4"×4"), will tend to bend due to the differential expansion of the molding compound and the substrate plate. Such bending may cause the ultimate contact between the substrate plate and a heat sink to be a line contact, and possibly even a point contact, rather than the desired surface contact, or may cause a break in the contact joint between the substrate plate and a heat sink soldered or bonded thereto. In either case, therefore, the bending will adversely affect the transfer of heat from the power module to the heat sink and may result in the semiconductor circuit components being damaged by inadequately dissipated heat generated during operation of the module.

The present invention overcomes these drawbacks of the known single-module power hybrid packages by providing transfer molded dual-module semiconductor power circuit packages in which any bending of the respective substrate plates during the molding and encapsulating operation is effectively inhibited. To this end, as shown in FIGS. 7 and 8, a package 35 according to one embodiment of the present invention includes a pair of semiconductor circuit modules the substrate plates 21 of which are disposed in spaced parallel relation to each other and symmetrically at opposite sides of the medial plane of the package. The respective faces 21a of the two substrate plates carrying the associated planar conductor layers 22-26 and the associated semiconductor circuit means 27-29 (only the circuit means 29 is shown in FIG. 8) confront each other inwardly of the package.

The two modules are provided with respective sets of stiff, electrically conductive, preferably copper, leads 36, 37, 38, 39, 40 and 41 (see FIG. 3) having respective outward end regions 36a-41a disposed substantially at the medial plane of the package and respective inward end regions 36b-41b offset from the plane of the outward end regions and electrically connected to respective ones of the planar conductor layers 22-26 of the associated circuit modules. Each of the outward end regions 36b-41b terminates in a respective end element 36d–41d (the lead 40 as illustrated has two such elements, but this is not essential). The package 35, it might be noted in passing, is here illustrated as including two identical semiconductor circuit modules arranged in mirror image relation to each other, so that the corresponding outward end regions of the two sets of leads and their end elements (the latter of which are intended, of course, for connection to respective exterior circuit components such as a power source, a load, etc.) essentially coincide with each other where they protrude from the package laterally of the same and the substrate plates. It will be understood, however, that depending on the ultimate end use environment of the package, the two modules may differ from each other in terms of the types, structures and arrangements of their respective electrical components, that the package may have leads projecting from three or even all four sides thereof, and that the positions of the outward end regions of the leads from either module need not coincide with the positions of the outward end regions from the leads of the other module.

The space between and around the peripheries of the two modules is occupied by a transfer molded body 42 of a suitable semiconductor grade thermosetting molding compound, for example a low thermal stress semiconductor epoxy molding compound such as is available commercially from the Hysol Division of The Dexter Corporation under the product designation MG36F. The molding material encapsulates all of the circuit components between the two substrate plates as well as the inward end regions of the leads and in the preferred embodiment of the invention also the outer peripheries of the substrate plates, the body 42 of molding compound having opposite faces 42a and 42b which in the preferred embodiment of the invention are flush with the outer or exposed faces 21b of the two substrate plates.

Referring now to FIGS. 10 and 11, it can be readily seen that the package 35' there shown is in all respects identical with the package 35 except that in the package 35' according to the preferred embodiment of the invention the body 42 of molding compound encapsulates the outer peripheries of the layers 34 of thermally highly conductive material affixed to the faces 21b of the substrate plates 21 and, where those layers are somewhat smaller than the substrate plate faces 21b, also covers the peripheral regions of those substrate plate faces. In the package 35', therefore, the opposite surfaces 42a and 42b of the body of molding compound are flush with the exposed faces 34a of the two layers 34. Other than this, a detailed description of the components of the package 35' is not deemed necessary herein at this time.

It is believed those skilled in the art will understand that the principal benefit of the present invention, namely, the resistance of the package 35 or 35' of the present invention to thermally induced bending, is attained by virtue of the symmetrical arrangement of the substrate plates of the two semiconductor circuit modules in the package. The arrangement ensures that during the molding of the package the full-surface contact between the inner surfaces of the mold and the outer faces 21b of the substrate plates (or the outer faces 34a of the layers 34 on the substrate plate faces 21b) precludes any outward bending of the substrate plates under the thermal expansion stresses generated in the mass of molding compound while it is curing in the mold. Thus, upon being removed from the mold after the same has been cooled to an extent sufficient to eliminate further differential expansion tendencies of the molding compound and the substrate plates, the package has precisely parallel and flat opposite faces (constituted at least in part by the outer faces of the substrate plates or the thermally conductive layers thereon) for engagement with respective heat sinks. This ensures the continuous and uniform maximum possible dissipation of the heat from the package when the same is subsequently put in use. The parallelism of the substrate plates will furthermore remain unimpaired during use of the package because the heat which will be generated by the power circuitry and to which the package will be subjected during such use will be so low relative to the heat applied in the mold that the possibility of differential expansion of the body 42 and the substrate plates 21 and a consequent bending of the latter during use of the package is for all practical purposes negligible.

For the purposes of the method according to the present invention for making a dual-module semiconductor circuit package 35 or 35', it is first necessary to provide for each module 20 to be incorporated in the package a respective stiff, planar, circumferentially closed frame 43 (see FIGS. 2 and 3) of electrical conductor material, for example copper, the shape and interior dimensions of which are such as to enable the frame to gird the respective substrate plate 21. The frame is shown as being rectangular, corresponding to the shape of the substrate plate 21, with four sides 43a, 43b, 43c and 43d, but obviously a different substrate plate shape might require a different frame shape. Located interiorly of each frame 43 is a respective set of tabs or strips 36–41 of the electrical conductor material of the frame, which tabs or strips will ultimately constitute the leads of the semiconductor circuit package, as hereinbefore described. Each of the tabs or strips 36–41 is affixed at its respective outward end region 36a–41a to the interior peripheral border of the associated frame by a respective reduced width portion or neck 36d–41d, two such portions 40d being shown merely by way of example at the tab or strip 40 only, although any of the other tabs or strips could be so formed. Preferably, the frame 43 and its attached leads are made of copper sheet about 0.4 mm to about 1 mm thick and may be formed by any suitable production technique, such as punching or etching, well known in the metal-working art.

For reasons which will be apparent from the foregoing description of the package, the tabs or strips 36–41 are so arranged that their respective outward end regions 36a–41a are located in the plane of their associated frame 43, while the inward end regions 36b–41b are offset from the plane of the frame. As can best be seen from FIGS. 3–5, the inward end regions 36b–41b of the leads are connected, in electrically conducting relation, to respective ones of the planar conductor layers 22–26 provided on the face 21a of the associated substrate plate 21. Thus, when a frame 43 and an associated substrate plate 21 are secured to each other as described, the substrate plate will be located in a plane parallel to the plane of the frame and spaced therefrom a distance determined by the degree of offset of the inward end regions 36b–41b of the leads from the plane of the frame (see FIGS. 4 and 5).

Two such lead frame and circuit module combinations are then assembled with each other, with the two frames being superposed on each other so that the surface of each frame which is directed away from its associated substrate plate engages the corresponding surface of the other frame, as clearly shown in FIGS. 6 and 9. As a consequence, the two substrate plates are spaced from and parallel to each other. Preferably, the degrees of offset of the inward end regions of the tabs or strips 36-41 from the plane of their respective frames 43 will be such as to make the perpendicular distance between the two second or outer faces 21b, or between the two outer faces 34a of the layers 34, a relatively small amount, say, 0.5 mm, greater than the corresponding distance between the two interior surfaces of the mold (not shown) in which the assembled frames and circuit modules are to be confined for the purposes of the molding operation. This is to ensure that, irrespective of possible manufacturing tolerances in th dimensions of the mold cavity, the substrate plates will be firmly engaged and backed up by the associated mold cavity surfaces, and hence precluded from any displacement away from each, other during both the cavity-filling stage and the subsequent curing stage of the molding operation.

As is conventional in any molding operation, of course, articles to be encapsulated in a molding material are ordinarily secured in the mold cavity against any possibility of shifting or displacement during the injection of the molding compound into the cavity. For this purpose, the frames 43 used in the process of the present invention are shown as being provided in their four corners with respective apertures 44 into which suitable locator pins provided in the mold halves can be fitted when the mold is closed, but other comparable means could be used to achieve the same purpose.

As previously indicated, in accordance with the basic principles of the present invention, the mold containing the assembled lead frame and circuit module combinations shown in FIGS. 6 and 9 constitutes a part of a transfer mold press, and the molding compound intended to form the body 42 of the ultimately desired package 35 or 35' is injected or forced into the mold cavity in conventional manner. The molding parameters (temperature, pressure, time) will, of course, be determined by the nature of the molding compound used and the sought for electrical, thermal and mechanical properties of final molded package. Merely by way of example, it might be pointed out that for a molding compound such as the hereinabove mentioned Hysol molding compound MG36F, the molding operation will be performed at a temperature of 170°-180° C., a pressure of 600-1200 psi, and over a time interval of 75-120 seconds for a ⅛ inch section, followed by a post cure time interval of six hours at 177° C. Among its physical and electrical properties most of interest in respect of the intended use of the packages according to the present invention, the molding compound is found to have a thermal conductivity (in cgs units) of $18 \times 10^{-4}$, a Young's modulus (at 25° C.) of $2.00 \times 10^6$ psi, a flexural strength of 16,000 psi, a flexural modulus of $2.00 \times 10^6$ psi, and a volume resistivity (at 500 volts and 25° C.) of $3.0 \times 10^{16}$ ohmcm. Packages according to the present invention can be seen, therefore, to have superior mechanical, thermal and electrical stability properties.

After the molding operation (including the post cure cycle), which has been found to cause no damage to the silicon chips, the bond wires, the leads and the planar conductor layers, has been completed and the temperature of the package has dropped to a point at which the differential expansion stresses in the molding compound and the substrate plates have reached negligibly low levels, the mold is opened and the package with the superposed frames 43 still surrounding the same and secured to the end elements 36d-41d of the outward end regions of the leads 36-41 is removed from the mold. The frames are then severed from the outward end regions of the leads at the extremities of the end elements 36d-41d, leaving the package either in the form shown in FIGS. 7-8 or in the form shown in FIGS. 10-11, with the outward end regions of the leads projecting laterally therefrom in condition for connection to exterior circuit components. It will be apparent, in this regard, that although the tabs or strips originally present in the frames 43 have been illustrated as extending inwardly thereof from the opposite side members 43a and 43c, and as a consequence projecting as leads from two opposite sides of the ultimate package 35 or 35', this is for purposes of example only and that the arrangement could be modified, depending on the ultimate end use environment of the package, to provide leads at three or all four sides of the frame and consequently projecting from three or all four sides of the package, etc.

It will be understood that the foregoing description of preferred embodiments of the present invention is intended for purposes of illustration only, and that the various structural and operational features herein disclosed are susceptible to a number of modifications and changes none of which entails any departure from the spirit and scope of the present invention as defined in the hereto appended claims. Thus, one of the two substrate plates 21 may be devoid of any semiconductor circuit means such as 27-9 and may serve only to provide the required thermal expansion balance during the molding stage, although in such a case the plate preferably will still have a set of planar conductor layers thereon to enable the associated frame 43 to be secured thereto. In use, of course, even such a substrate plate will provide the package with a second face for contact with a second heat sink so as to enable a 2-sided cooling of the package. Other variations will readily suggest themselves to those skilled in the art.

What is claimed is:

1. A semiconductor circuit package for use in high power applications; said package comprising:
    (a) first and second substrate plates each having (i) a first flat face, (ii) a second flat face parallel to said first flat face, and (iii) an outwardly directed peripheral edge face, said substrate plates being arranged in spaced, substantially parallel relation to each other with said first flat faces thereof directed toward each other and with said second flat faces thereof directed away from each other, at least one of said substrate plates on said first flat face thereof having affixed thereto a respective plurality of discrete planar conductor layers, and at least one of said substrate plates at said first flat face thereof carrying semiconductor circuit means electrically connected to one or more of said planar conductor layers;
    (b) leads extending laterally of said substrates plates, each lead having (i) an outward end region adapted to be electrically connected to exterior circuit components, and (ii) an inward end region affixed to a respective one of said planar conductor layers; and
    (c) a transfer molded body of thermosetting semiconductor grade molding compound filling the space between said substrate plates and encapsulating said first flat faces of said substrate plates, said conductor layers, said semiconductor circuit means and said inward end regions of said leads, said outward end regions of said leads and said second flat faces of said first and second substrate plates being free of molding compound;

(d) said package by virtue of its construction being resistant to thermally induced bending of said substrate plates both during and at all times subsequent to the molding of said body of molding compound;

(e) whereby said second flat face of each of said first and second substrate plates remains substantially flat and substantially parallel to said second flat face of the other of said first and second substrate plates, and the package is adapted for full-surface contact of each substrate plate at said second flat face thereof with a respective heat sink.

2. A semiconductor circuit package for use in high power applications; said package comprising:

(a) first and second substrate plates each having (i) a first flat face, (ii) a second flat face parallel to said first flat face, and (iii) an outwardly directed peripheral edge face, said substrate plates being arranged in spaced, substantially parallel relation to each other with said first flat faces thereof directed toward each other and with said second flat faces thereof directed away from each other, at least one of said substrate plates on said first flat face thereof having affixed thereto a respective plurality of discrete planar conductor layers, at least one of said substrate plates on said second flat face thereof having affixed thereto a respective layer which has a peripheral edge and is made of a material which is thermally highly conductive relative to that substrate plate, and at least one of said substrate plates at said first flat face thereof carrying semiconductor circuit means electrically connected to one or more of said planar conductor layers;

(b) leads extending laterally of said substrate plates, each lead having (i) an outward end region adapted to be electrically connected to exterior circuit components, and (ii) an inward end region affixed to a respective one of said planar conductor layers; and (c) a transfer molded body of thermosetting semiconductor grade molding compound filling the space between said substrate plates and encapsulating said first flat faces of said substrate plates, said conductor layers, said semiconductor circuit means and said inward end regions of said leads, said outward end regions of said leads and the face of each layer of thermally highly conductive material which is directed away from said second face of its associated substrate plate and exposed being free of molding compound;

(d) said package by virtue of its construction being resistant to thermally induced bending of said substrate plates both during and at all times subsequent to the molding of said body of molding compound;

(e) whereby said second flat face of each of said first and second substrate plates remains substantially flat and substantially parallel to said second flat face of the other of said first and second substrate plates, and the package is adapted for full-surface contact of said layer of thermally highly conductive material on said at least one substrate plate at said exposed face of that layer with a respective heat sink.

3. A semiconductor circuit package according to claim 1 or 2, wherein said semiconductor circuit means comprises at least one large scale integrated power circuit.

4. A semiconductor circuit package according to claim 1 or 2, wherein said semiconductor circuit means comprises at least one large transistor.

5. A semiconductor circuit package according to claim 1 or 2, wherein each of said first and second substrate plates at said first flat face thereof carries respective semiconductor circuit means electrically connected to one or more of the associated planar conductor layers.

6. A semicondutor circuit package according to claim 1 or 2, wherein said body also encapsulates said peripheral edge faces of said substrate plates.

7. A semiconductor circuit package according to claim 1, wherein said body also encapsulates said peripheral edge faces of said substrate plates and further has opposite parallel planar surfaces which are flush, respectively, with said second flat faces of said substrate plates.

8. A semicondutor circuit package according to claim 2 wherein said body also encapsulates said peripheral edge faces of said substrates plates and said peripheral edges of said layers of thermally highly conductive material.

9. A semiconductor circuit package according to claim 8, wherein said body further has opposite parallel planar surfaces which are flush respectively, with said exposed faces of said layers of thermally highly conductive material.

10. A semiconductor circuit package according to claim 1 or 2, wherein said leads include first and second sets of leads, the leads in each set having their respective outward end regions disposed substantially at the medial plane of the package and further having their respective inward end region offset from the plane of the outward end regions, and said inward end regions of each set of leads are electrically connected to respective ones of the planar conductor layers on a respective one of said first and second substrate plates.

11. A semiconductor circuit package according to claim 10, wherein two identical semiconductor circuit modules each comprising an identical arrangement of planar conductor layers and semiconductor circuit means on a respective substrate plate are disposed in mirror image relation to each other, and the corresponding outward end regions of the two sets of leads up to their outward end elements essentially coincide with and overlie each other where they protrude from the package laterally of the molded body.

* * * * *